US012080580B2

(12) United States Patent
Cho et al.

(10) Patent No.: US 12,080,580 B2
(45) Date of Patent: Sep. 3, 2024

(54) METHOD FOR MANUFACTURING DISPLAY DEVICE, AND SUBSTRATE FOR MANUFACTURING DISPLAY DEVICE

(71) Applicant: LG ELECTRONICS INC., Seoul (KR)

(72) Inventors: Hyunwoo Cho, Seoul (KR); Bongchu Shim, Seoul (KR); Hyeyoung Yang, Seoul (KR); Jisoo Ko, Seoul (KR); Wonjae Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 290 days.

(21) Appl. No.: 17/628,776

(22) PCT Filed: Feb. 11, 2020

(86) PCT No.: PCT/KR2020/001887
§ 371 (c)(1),
(2) Date: Jan. 20, 2022

(87) PCT Pub. No.: WO2021/025249
PCT Pub. Date: Feb. 11, 2021

(65) Prior Publication Data
US 2022/0319892 A1    Oct. 6, 2022

(30) Foreign Application Priority Data

Aug. 8, 2019  (KR) .................. 10-2019-0096933

(51) Int. Cl.
*H01L 21/68*  (2006.01)
*H01L 21/683*  (2006.01)
(Continued)

(52) U.S. Cl.
CPC .......... *H01L 21/68* (2013.01); *H01L 21/6833* (2013.01); *H01L 21/6835* (2013.01);
(Continued)

(58) Field of Classification Search
CPC ................ H01L 21/68; H01L 21/6833; H01L 21/6835; H01L 21/683; H01L 2221/68354;
(Continued)

(56) References Cited

U.S. PATENT DOCUMENTS 9,825,202 B2    11/2017  Schuele et al.
2007/0145383 A1*    6/2007  Rho .................... H01L 25/0753
                                                    257/E25.02
2022/0328335 A1    10/2022  Shim et al.

FOREIGN PATENT DOCUMENTS

EP            3993051        5/2022
KR     10-2018-0020239        2/2018
(Continued)

OTHER PUBLICATIONS

PCT International Application No. PCT/KR2020/001887, International Search Report dated May 19, 2020, 8 pages.
European Patent Office Application Serial No. 20849453.4, Search Report dated Aug. 8, 2023, 8 pages.

*Primary Examiner* — Timothy J Thompson
*Assistant Examiner* — Guillermo J Egoavil
(74) *Attorney, Agent, or Firm* — LEE, HONG, DEGERMAN, KANG & WAIMEY

(57) ABSTRACT

The present invention provides an assembly substrate used in a method for manufacturing a display device which mounts semiconductor light emitting devices on a predetermined position of an assembly substrate by using an electric field and a magnetic field. Specifically, the assembly substrate is characterized by comprising: a base part; a plurality of assembly electrodes formed extending in one direction and disposed on the base part; a dielectric layer laminated on the base part so as to cover the assembly electrodes; a partition wall formed on the base part and including a plurality of grooves for guiding the semiconductor light emitting devices to a predetermined position; and a metal shielding layer formed on the base part, wherein each of the (Continued)

plurality of grooves penetrates the partition wall so as to form a seating surface on which the guided light emitting devices are seated, and the metal shielding layer overlaps with a part of the seating surface such that an electric field formed on a part of the seating surface is shielded.

6 Claims, 19 Drawing Sheets

(51) Int. Cl.
*H01L 25/075* (2006.01)
*H01L 33/00* (2010.01)
(52) U.S. Cl.
CPC ........ *H01L 25/0753* (2013.01); *H01L 33/007* (2013.01); *H01L 33/0075* (2013.01); *H01L 33/0093* (2020.05); *H01L 2221/68354* (2013.01); *H01L 2221/68368* (2013.01)

(58) Field of Classification Search
CPC ........... H01L 2221/68368; H01L 2224/95101; H01L 25/0753; H01L 33/007; H01L 33/0075; H01L 33/0093; H01L 33/0095; H01L 33/20
USPC ........................................................ 174/250
See application file for complete search history.

(56) References Cited

FOREIGN PATENT DOCUMENTS

| KR | 10-2018-0051006 | 5/2018 | | |
|----|-----------------|--------|---|---|
| KR | 10-2019-0075869 | 7/2019 | | |
| KR | 10-2019-0076929 | 7/2019 | | |
| KR | 10-2019-0085892 | 7/2019 | | |
| KR | 20190075869 A | * | 7/2019 | ......... H01L 27/1214 |

* cited by examiner

【FIG. 1】
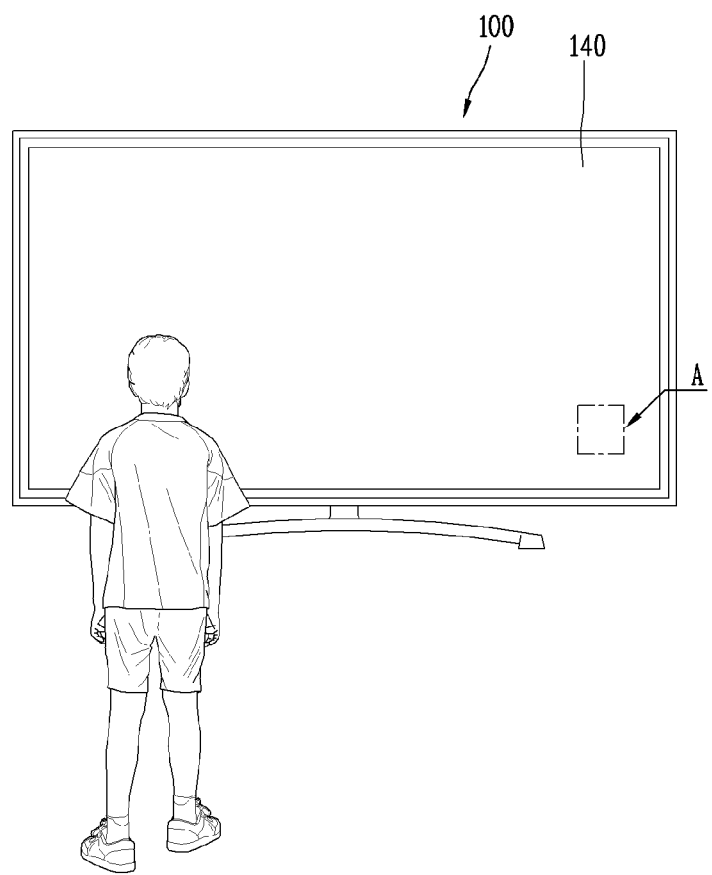

[FIG. 2]
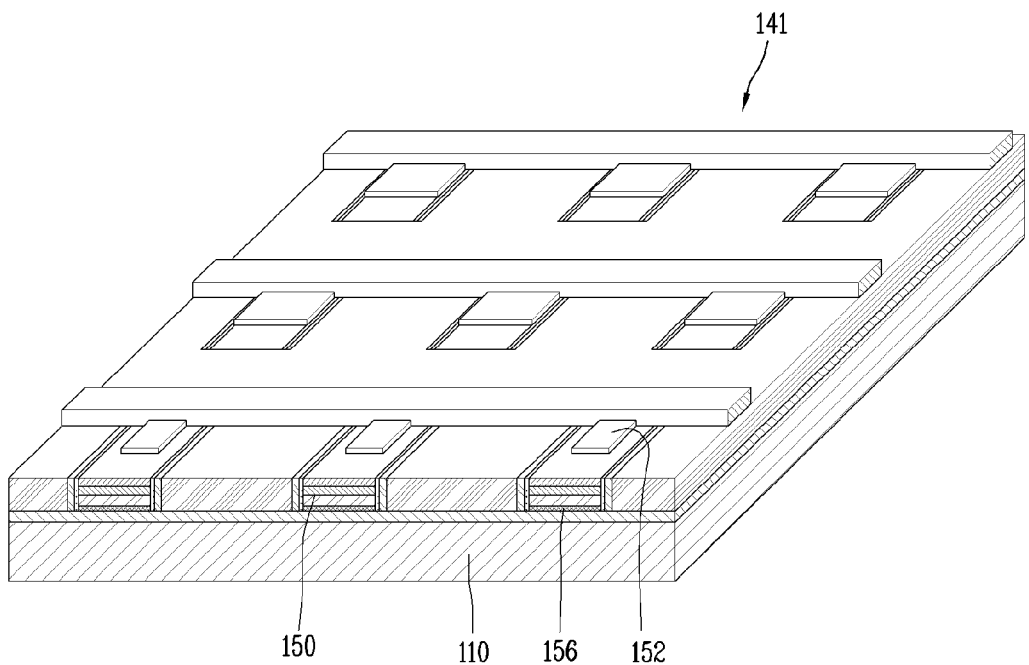

[FIG. 3]
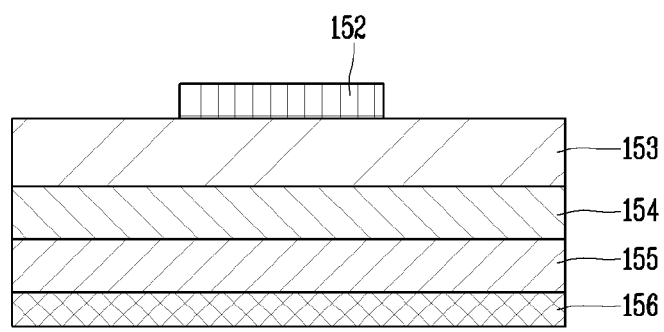
[FIG. 4]
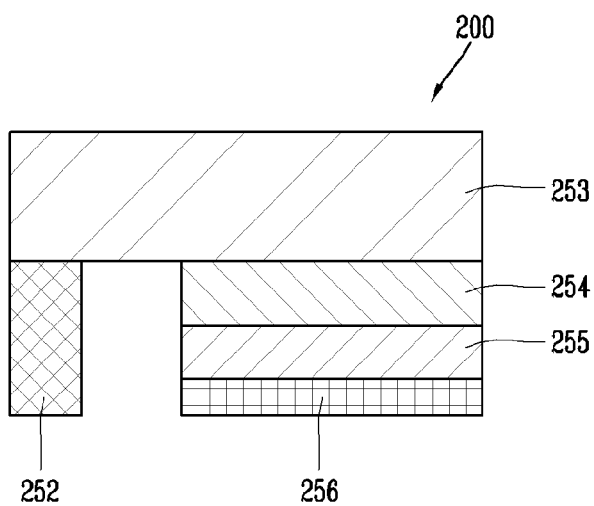

[FIG. 5a]
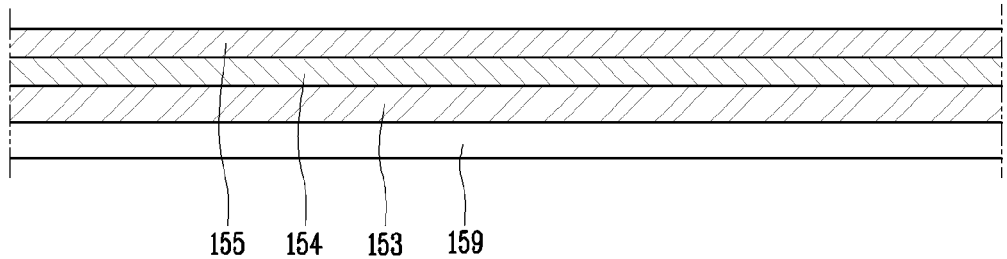
155 154 153 159
[FIG. 5b]
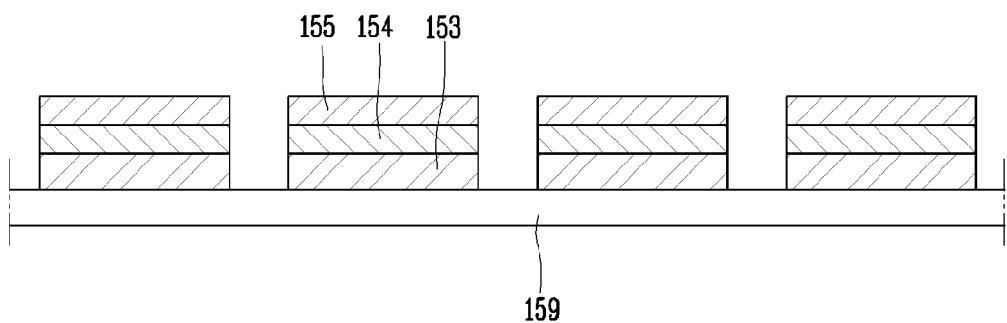
155 154 153
159
[FIG. 5c]
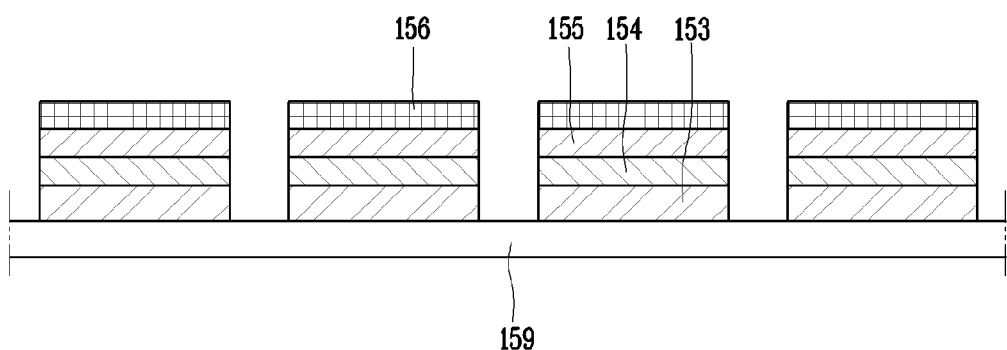
156   155 154 153
159

【FIG. 5d】
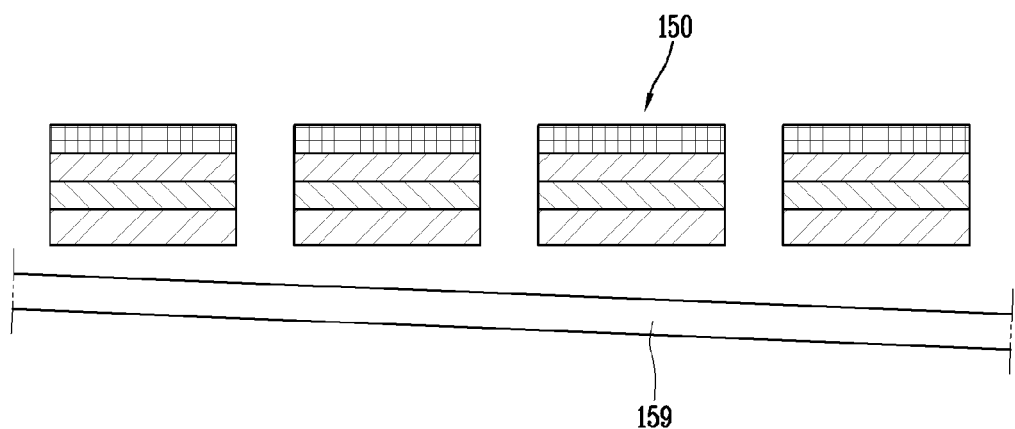
【FIG. 5e】
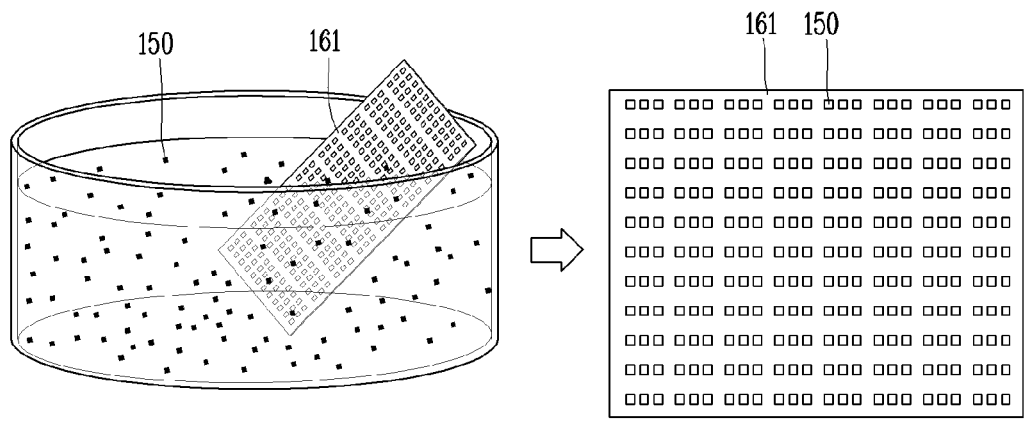

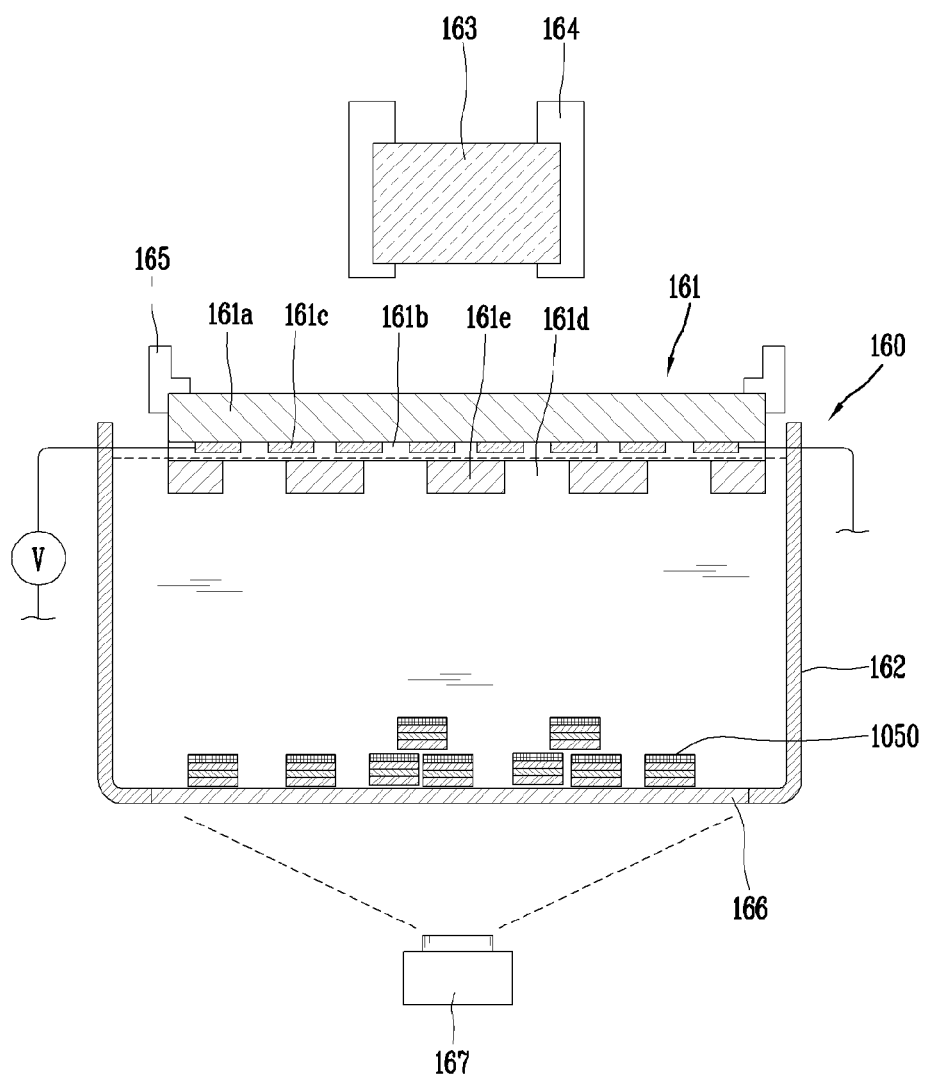
[FIG. 6]

[FIG. 7]
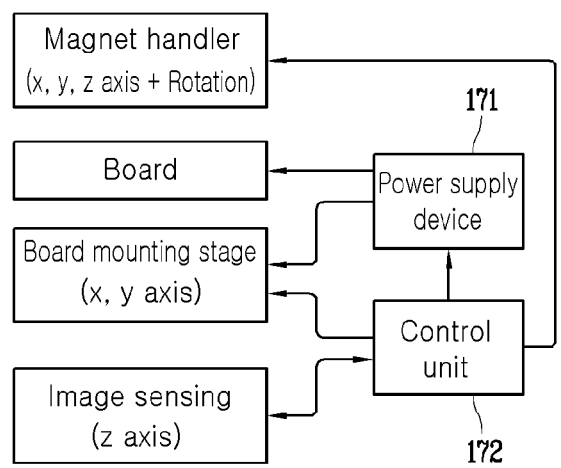

[FIG. 8a]
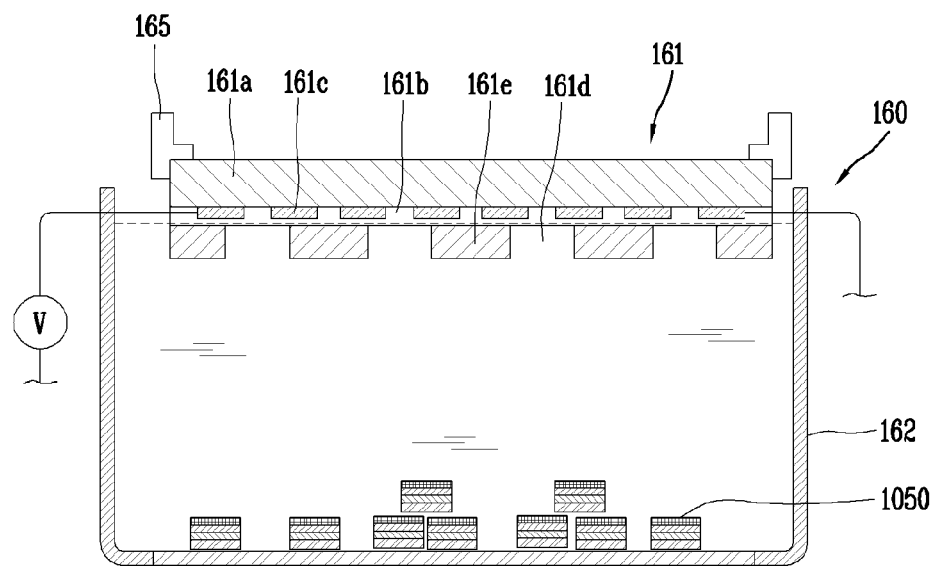
[FIG. 8b]
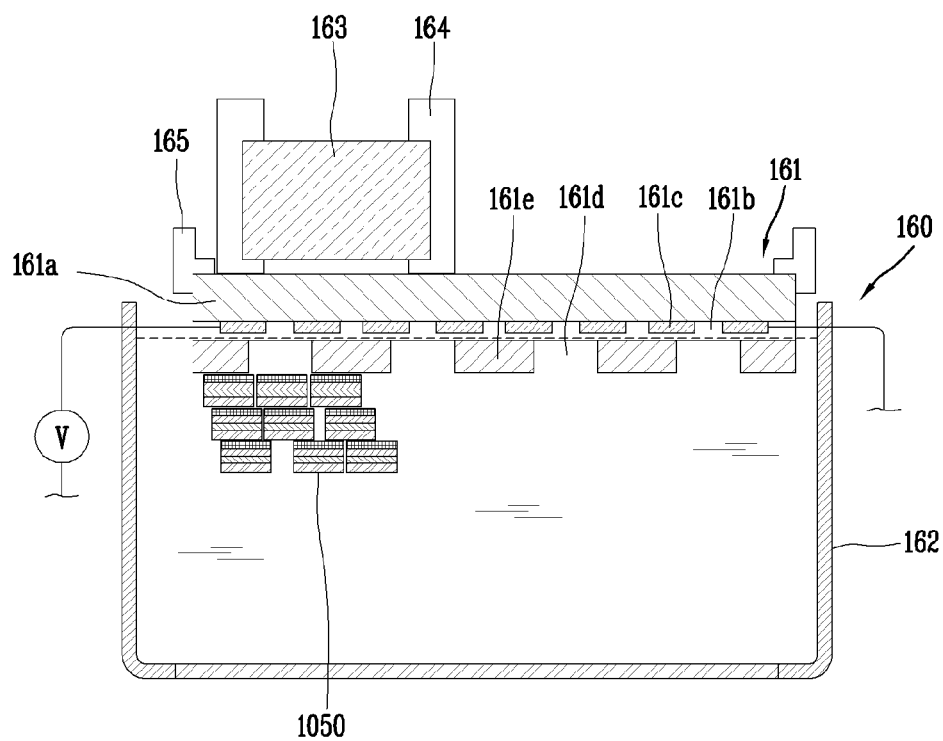

[FIG. 8c]
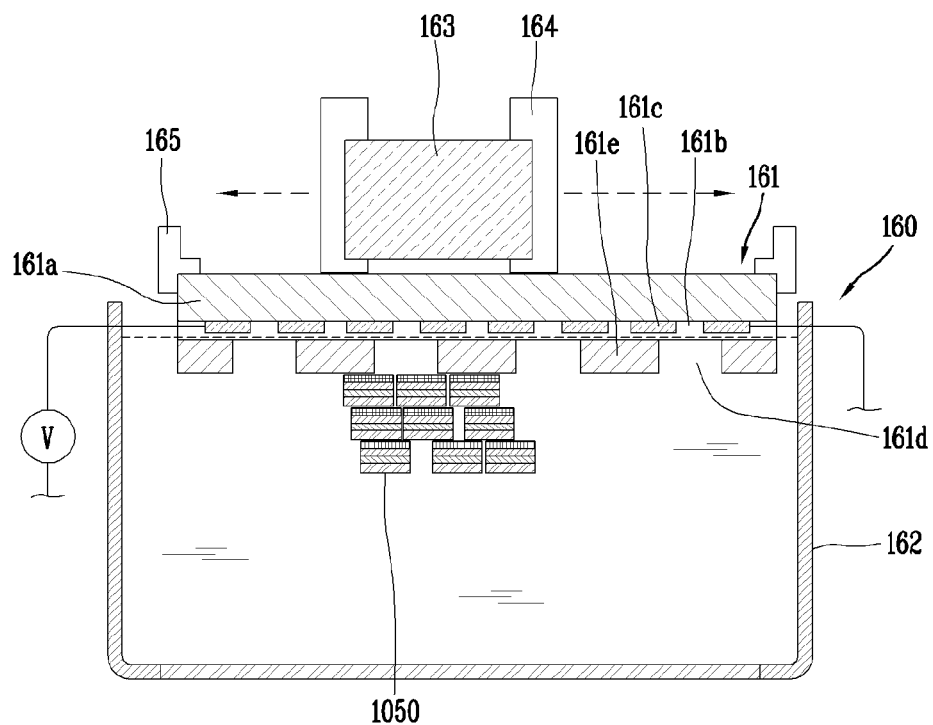
[FIG. 8d]
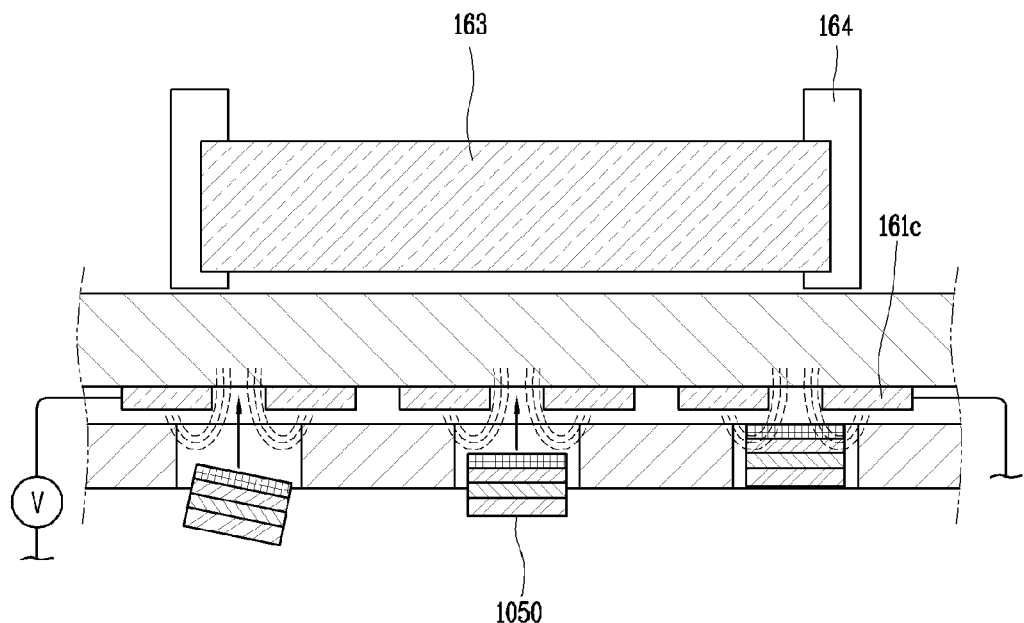

【FIG. 8e】
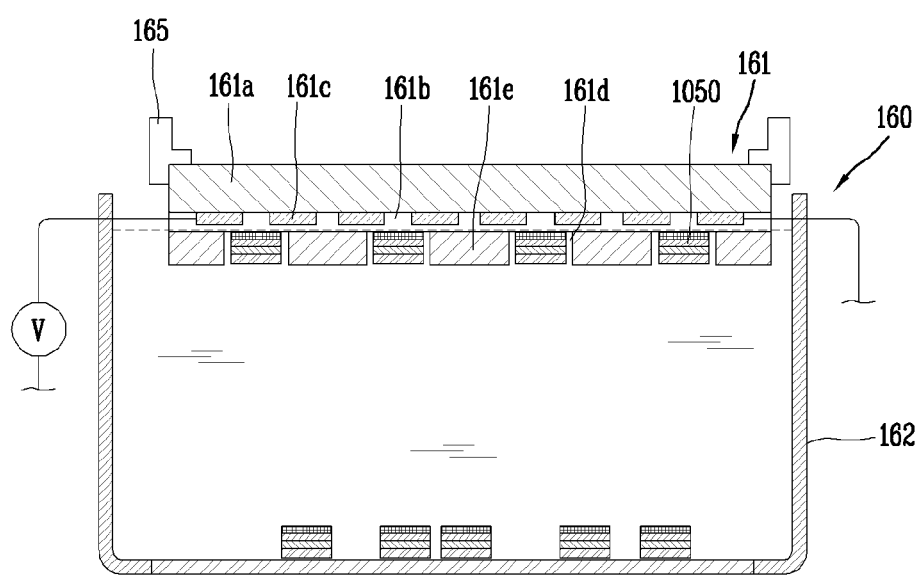

[FIG. 9]
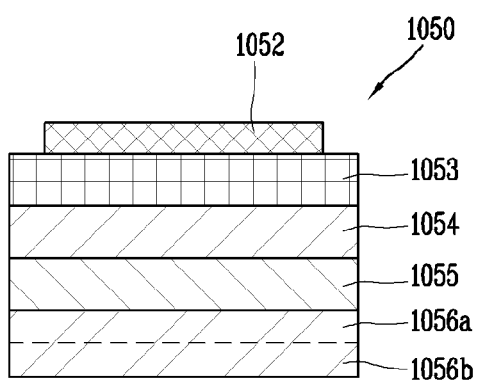

【FIG. 10a】
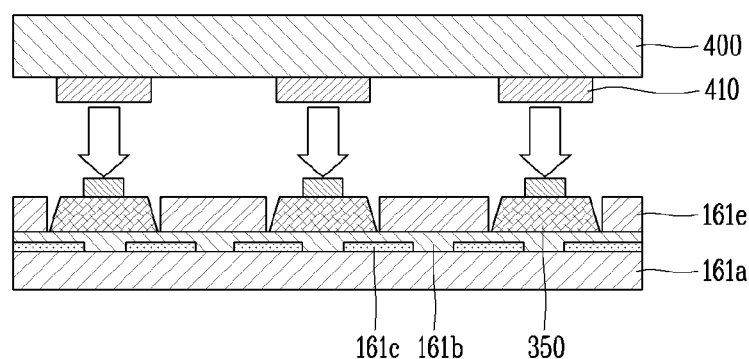
【FIG. 10b】
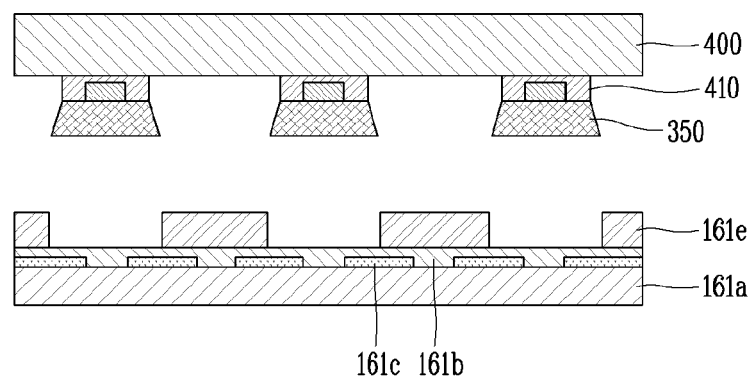

[FIG. 10c]
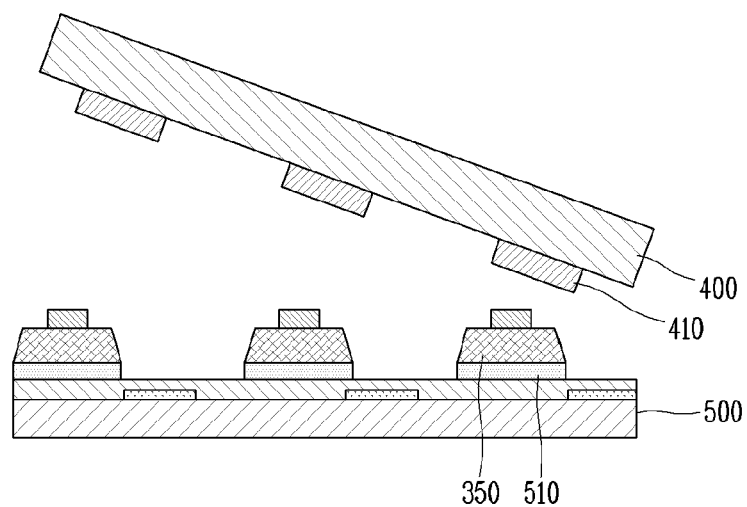

[FIG. 11]
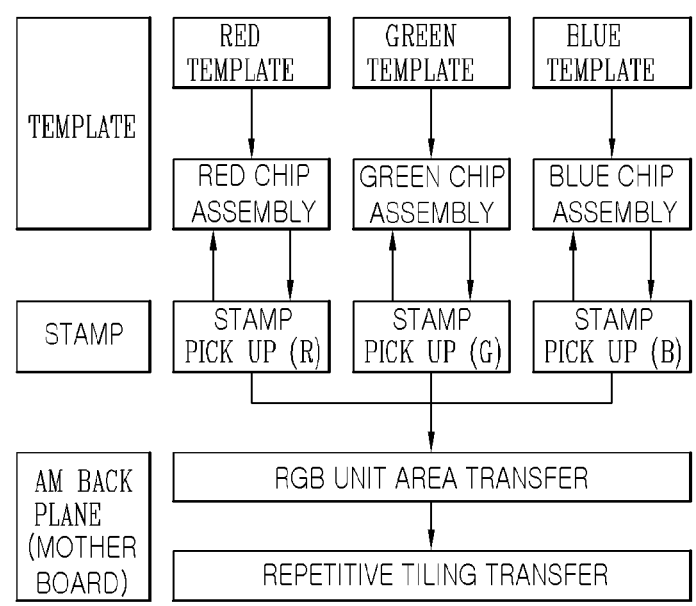

[FIG. 12]
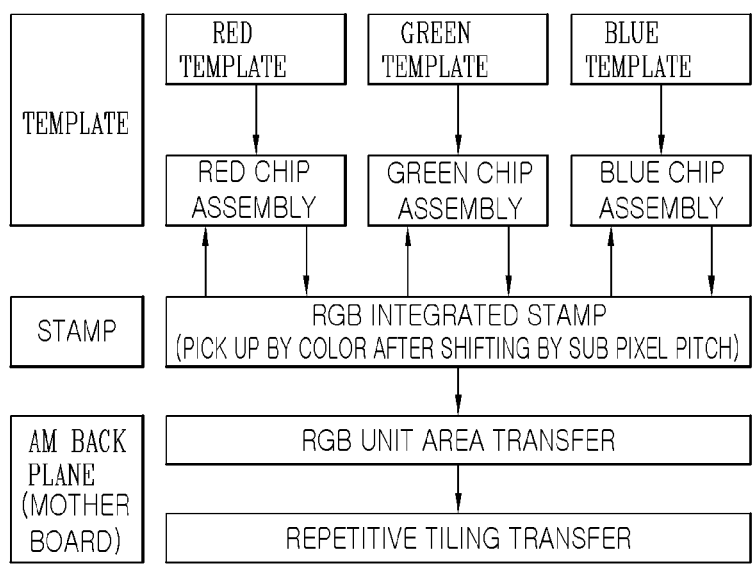

[FIG. 13]
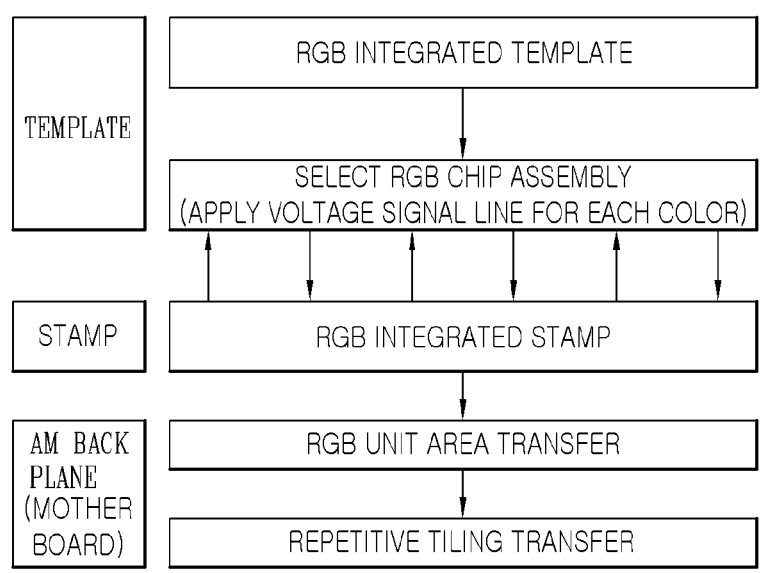

[FIG. 14]
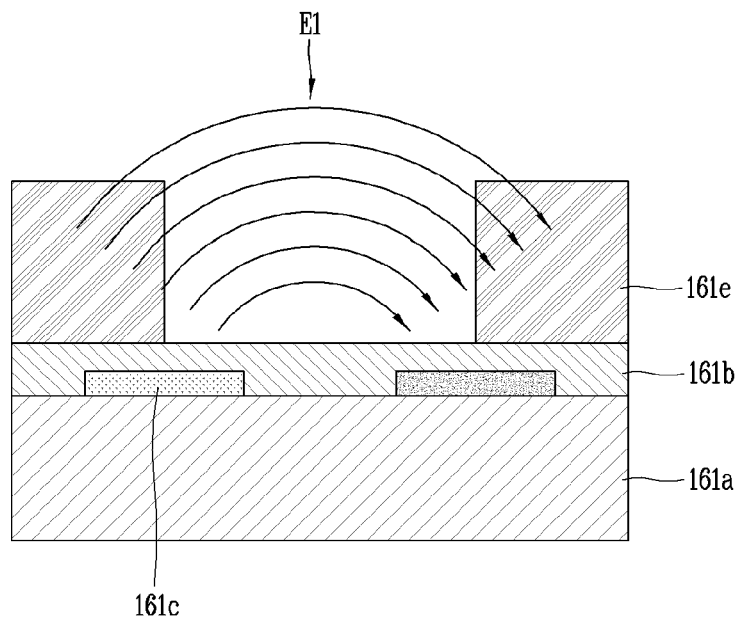
[FIG. 15]
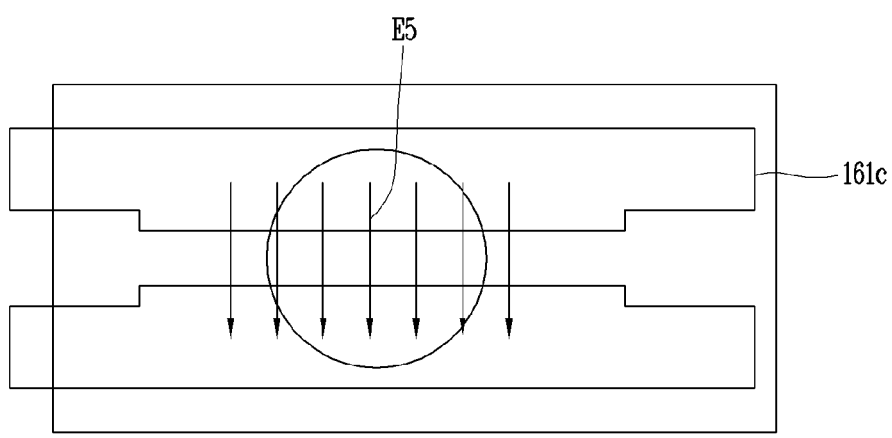

[FIG. 16]
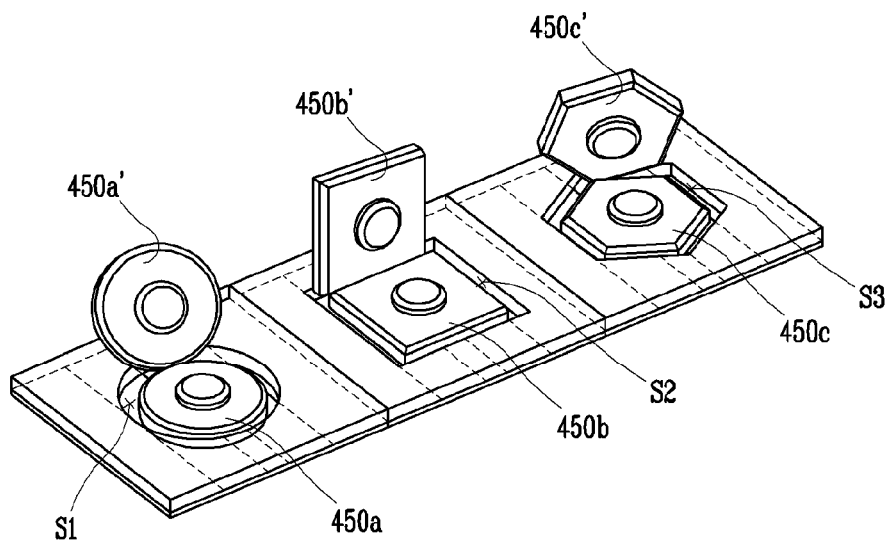
[FIG. 17]
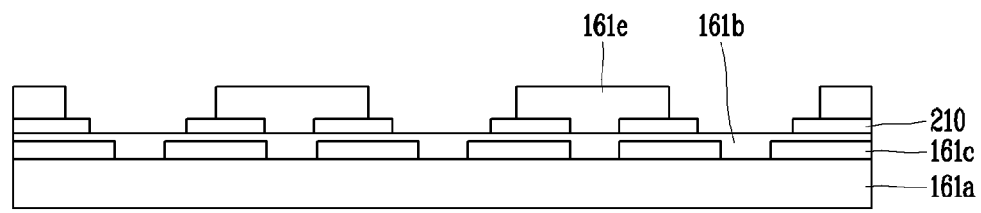
[FIG. 18]
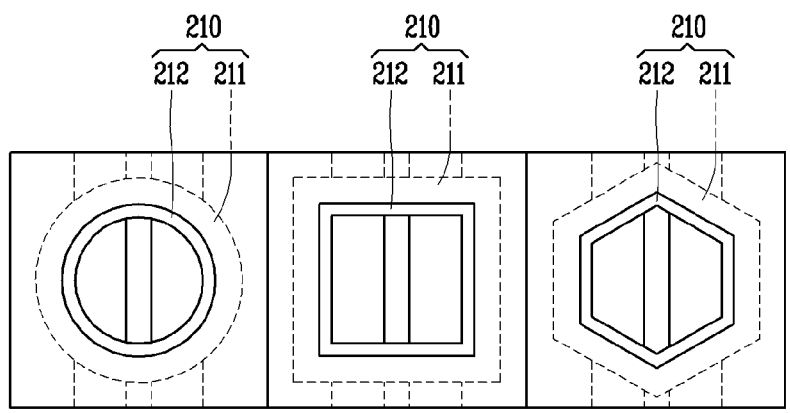

[FIG. 19]
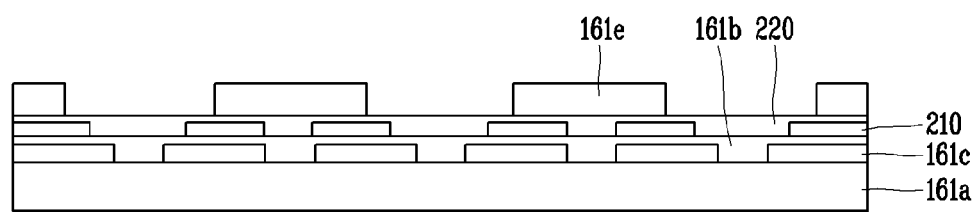
[FIG. 20]
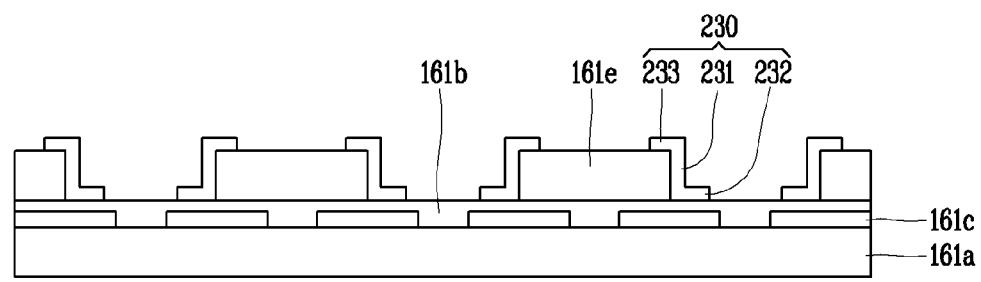
[FIG. 21]
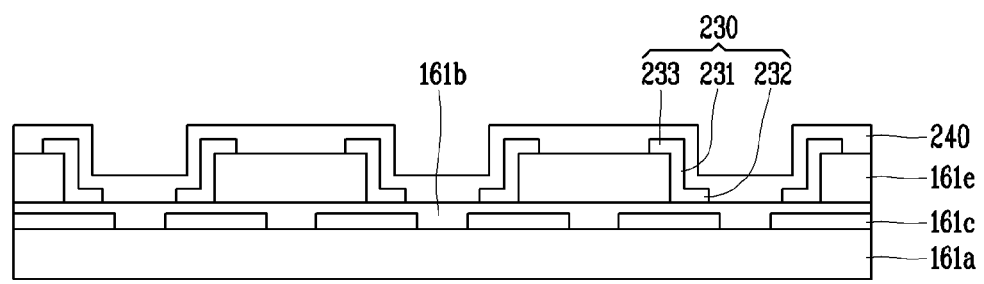

METHOD FOR MANUFACTURING DISPLAY DEVICE, AND SUBSTRATE FOR MANUFACTURING DISPLAY DEVICE

CROSS-REFERENCE TO RELATED APPLICATIONS

This application is the National Stage filing under 35 U.S.C. 371 of International Application No. PCT/KR2020/001887, filed on Feb. 11, 2020, which claims the benefit of earlier filing date and right of priority to Korean Application No. 10-2019-0096933, filed on Aug. 8, 2019, the contents of which are all hereby incorporated by reference herein their entirety.

TECHNICAL FIELD

The present disclosure relates to a method of manufacturing a display device, and more particularly, to a method for manufacturing a display device using semiconductor light emitting diodes having a size of several μm to several tens of μm, and an assembly board used to manufacture the display device.

BACKGROUND ART

Recently, liquid crystal displays (LCD), organic light emitting diode (OLED) displays, and micro LED displays are competing to implement large-area displays in the display technology field.

On the other hand, when a semiconductor light emitting diode (micro LED (uLED)) having a diameter or cross-sectional area of 100 microns or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may include pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of micro LEDs is still insufficient. Accordingly, the present disclosure proposes a new type of manufacturing method and manufacturing apparatus for enabling self-assembly of micro LEDs.

DISCLOSURE

Technical Problem

One object of the present disclosure is to provide a new manufacturing process having high reliability in a large-screen display using micro-sized semiconductor light emitting diodes.

Another object of the present disclosure is to provide a manufacturing process capable of improving transfer precision when semiconductor light emitting diodes are self-assembled to an assembly board.

Another object of the present disclosure is to prevent mis-assembly of a semiconductor light emitting diode between a tolerance formed between a pre-assembled semiconductor light emitting diode and a barrier rib during self-assembly.

Technical Solution

In order to achieve the above objects, the present disclosure provides an assembly board used in a method for manufacturing a display device which allows semiconductor light emitting diodes to be seated at preset positions of the assembly board using an electric field and a magnetic field. The assembly board includes a base portion, a plurality of assembly electrodes extending in one direction and disposed on the base portion, a dielectric layer stacked on the base portion to cover the assembly electrodes, barrier ribs having a plurality of grooves for guiding the semiconductor light emitting diodes to preset positions and formed on the base portion, and a metal shielding layer formed on the base portion, wherein the plurality of grooves respectively pass through the barrier ribs to form seating surfaces on which the guided light emitting diodes are seated, and the metal shielding layer overlaps a portion of the seating surfaces such that an electric field formed on the portion of the seating surfaces is shielded.

According to an embodiment, the metal shielding layer may be formed to overlap with edges of the seating surfaces.

According to an embodiment, the metal shielding layer may include a first region disposed between the barrier rib and the dielectric layer and a second region extending from the first region to overlap the seating surfaces.

According to an embodiment, the assembly board may further include an insulating layer formed to cover the metal shielding layer.

According to an embodiment, the seating surfaces may be formed on one surface of the insulating layer.

According to an embodiment, the metal shielding layer may include a base portion formed on a sidewall of the groove and a shielding portion extending from the base portion and extending along the dielectric layer to overlap the seating surfaces.

According to an embodiment, the metal shielding layer may include a protrusion extending from the base portion and formed on upper surfaces of the barrier ribs.

According to an embodiment, the protrusion may be formed to surround the groove.

According to an embodiment, the seating surfaces may be formed on one surface of the dielectric layer.

According to an embodiment, the assembly board may further include an insulating layer formed to cover the metal shielding layer, and the seating surfaces may be formed on one surface of the insulating layer.

Advantageous Effects

According to the present disclosure having the above configuration, in a display device in which individual pixels are formed of micro light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

In addition, according to the manufacturing method of the present disclosure, semiconductor light emitting diodes in a solution are transferred simultaneously in place using a magnetic field and an electric field, thereby realizing low-cost, high-efficiency, and high-speed transfer regardless of the size, number, or transfer area of parts.

Furthermore, since assembly is performed using an electric field, selective assembly is possible through selective application of the electric field without a separate additional device or process. In addition, loading and unloading of the board can be facilitated by arranging the assembly board on the upper side of the chamber, and non-specific binding of the semiconductor light emitting diodes can be prevented.

In addition, when the assembly board according to the present disclosure is used, it is possible to prevent an electric field from being formed in an unnecessary position, so that self-assembly precision can be improved. Specifically, the present disclosure prevents an electric field from being formed in a space between the pre-assembled semiconductor light emitting diode and the barrier rib, so that the semiconductor light emitting diode floating in the fluid is not guided between the pre-assembled semiconductor light emitting diode and the barrier rib.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8A to 8E are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIGS. 10A to 10C are conceptual views illustrating a state in which a semiconductor light emitting diode is transferred after a self-assembly process according to the present disclosure.

FIGS. 11 to 13 are flowcharts illustrating a method of manufacturing a display device including semiconductor light emitting diodes that emit red (R) light, green (G) light, and blue (B) light.

FIGS. 14 and 15 are conceptual diagrams for describing a form of an electric field formed between assembly electrodes.

FIG. 16 is a conceptual diagram illustrating an example in which a semiconductor light emitting diode is incorrectly assembled.

FIG. 17 is a cross-sectional view of an assembly board according to the present disclosure.

FIG. 18 is a conceptual view of an assembly board according to the present disclosure viewed from the top of the board.

FIGS. 19 to 21 are conceptual views illustrating an assembly board according to another embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings.

It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 200 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 159 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5a to 5c. In this case, in the process of forming the second conductivity type electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

On the other hand, the present disclosure provides a structure and method for an assembly board for increasing the yield of the above-described self-assembly process and the process yield after self-assembly. The present disclosure is limited to a case where the board 161 is used as an assembly board. That is, the assembly board, which will be described later, is not used as a wiring board of the display device. Accordingly, the board 161 will be referred to as an assembly board 161 hereinafter.

The present disclosure improves the process yield in two respects. First, according to the present disclosure, it is possible to prevent an electric field from occurring strongly at an unwanted position, and the semiconductor light emitting diode from being seated at an unwanted position. Second, according to the present disclosure, it is possible to prevent a semiconductor light emitting diode from remaining on the assembly board when semiconductor light emitting diodes seated on the assembly board are transferred to another board.

The above-described objects are not individually achieved by different components. The two objects described above may be achieved by organically combining the components to be described later and the assembly board 161 described above.

Before describing the present disclosure in detail, a post-process for manufacturing a display device after self-assembly will be described.

FIGS. 10A to 10C are conceptual views illustrating a state in which a semiconductor light emitting diode is transferred after a self-assembly process according to the present disclosure.

When the self-assembly process described with reference to FIGS. 8A to 8E is finished, the semiconductor light emitting diodes have been seated at preset positions of the assembly board 161. The semiconductor light emitting diodes seated on the assembly board 161 are transferred to another board at least once. Although the semiconductor light emitting diodes mounted on the assembly board 161 are described as being transferred twice in the present specification, the present disclosure is not limited thereto, and the semiconductor light emitting diodes mounted on the assembly board 161 may be transferred to another board once or three times.

On the other hand, immediately after the self-assembly process is finished, the assembly surface of the assembly board 161 is facing downward (or in the direction of gravity). For processes after the self-assembly process, the assembly board 161 may be turned 180 degrees in a state in which the semiconductor light emitting diode are seated thereon. In this process, since there is a risk that the semiconductor light emitting diode is separated from the assembly board 161, a voltage may be applied to a plurality of electrodes 161c (hereinafter, assembly electrodes) while the assembly board 161 is being turned over. An electric field formed between the assembly electrodes may prevent the semiconductor light emitting diodes from being separated from the assembly board 161 while the assembly board 161 is being turned over.

When the assembly board 161 is turned over 180 degrees after the self-assembly process, the state is as shown in FIG. 10a. Specifically, as shown in FIG. 10a, the assembly surface of the assembly board 161 is facing upward (or in a direction opposite to gravity). In this state, the transfer board 400 is aligned above the assembly board 161.

The transfer board 400 is a board for transferring the semiconductor light emitting diodes seated on the assembly board 161 to a wiring board by detaching the semiconductor light emitting diodes. The transfer board 400 may be formed of a polydimethylsiloxane (PDMS) material. Accordingly, the transfer board 400 may be referred to as a PDMS board.

The transfer board 400 is pressed to the assembly board 161 after being aligned with the assembly board 161. Thereafter, when the transfer board 400 is transferred to the upper side of the assembly board 161, the semiconductor light emitting diodes 350 disposed on the assembly board 161 are transferred to the transfer board 400 due to the adhesion of the transfer board 400.

To this end, the surface energy between the semiconductor light emitting diodes 350 and the transfer board 400 should be higher than the surface energy between the semiconductor light emitting diodes 350 and the dielectric layer 161b. Since probability that the semiconductor light emitting diodes 350 are separated from the assembly board 161 increases as the difference between the surface energy between the semiconductor light emitting diodes 350 and the transfer board 400 and the surface energy between the semiconductor light emitting diodes 350 and the dielectric layer 161b increases, it is preferable that the difference between the two surface energies is greater.

On the other hand, when the transfer board 400 is pressed against the assembly board 161, the transfer board 400 may include a plurality of protrusions 410 such that the pressure applied by the transfer board 400 is concentrated on the semiconductor light emitting diodes 350. The protrusions 410 may be formed at the same interval as the semiconductor light emitting diodes seated on the assembly board 161. When the projections 410 are aligned to overlap the semiconductor light emitting diodes 350 and then the transfer board 400 is pressed against the assembly board 161, the pressure exerted by the transfer board 400 may be concentrated to only the semiconductor light emitting diodes 350. Through this, the present disclosure increases the probability that the semiconductor light emitting diodes are separated from the assembly board 161.

Meanwhile, it is preferable that a portion of the semiconductor light emitting diode is exposed to the outside of the groove while the semiconductor light emitting diode is seated on the assembly board 161. When the semiconductor light emitting diode 350 is not exposed to the outside of the groove, the pressure by the transfer board 400 is not concentrated on the semiconductor light emitting diode 350, thus reducing probability that the semiconductor light emitting diode 350 is separated from the assembly board 161.

Finally, referring to FIG. 10c, the semiconductor light emitting diodes 350 are transferred from the transfer board 400 to the wiring board 500 by pressing the transfer board 400 against the wiring board 500. In this case, a protrusion 510 may be formed on the wiring board 500. The transfer board 400 and the wiring board 500 are aligned with each other such that the semiconductor light emitting diodes 350 disposed on the transfer board 400 overlap the protrusions 510. Thereafter, when the transfer board 400 and the wiring board 500 are compressed, the probability that the semiconductor light emitting diodes 350 are separated from the transfer board 400 may increase due to the protrusions 510.

Meanwhile, in order for the semiconductor light emitting diodes 350 disposed on the transfer board 400 to be transferred to the wiring board 500, the surface energy between the semiconductor light emitting diodes 350 and the wiring board 500 should be higher than the surface energy between the semiconductor light emitting diodes 350 and the transfer board 400. Since probability that the semiconductor light emitting diodes 350 are separated from the transfer board 400 increases as the difference between the surface energy between the semiconductor light emitting diodes 350 and the wiring board 500 and the surface energy between the semiconductor light emitting diodes 350 and the transfer board 400 increases, it is preferable that the difference between the two surface energies is greater.

After transferring all the semiconductor light emitting diodes 350 disposed on the transfer board 400 to the wiring board 500, electrical connections between the semiconductor light emitting diodes 350 and the wiring electrodes formed on the wiring board may be formed. The structure of the wiring electrode and the method of forming the electrical connection may be changed depending on the type of the semiconductor light emitting diode 350.

Meanwhile, although not shown, an anisotropic conductive film may be disposed on the wiring board 500. In this case, the electrical connections may be formed between the semiconductor light emitting diodes 350 and the wiring electrodes formed on the wiring board 500 only by pressing the transfer board 400 and the wiring board 500.

Meanwhile, in the case of manufacturing a display device including semiconductor light emitting diodes emitting different colors, the method described with reference to FIGS. 10A to 10C may be implemented in various ways. Hereinafter, a method of manufacturing a display device including semiconductor light emitting diodes that emit red (R) light, green (G) light, and blue (B) light will be described.

FIGS. 11 to 13 are flowcharts illustrating a method of manufacturing a display device including semiconductor light emitting diodes that emit red (R) light, green (G) light, and blue (B) light.

The semiconductor light emitting diodes emitting different colors may be individually assembled on different assembly boards. Specifically, the assembly board 161 may include a first assembly board on which semiconductor light emitting diodes emitting a first color are mounted, a second assembly board on which semiconductor light emitting diodes emitting a second color different from the first color are mounted, and a third assembly board on which semiconductor light emitting diodes emitting a third color different from the first and second colors are mounted. Different types of semiconductor light emitting diodes are assembled on the assembly boards according to the method described with reference to FIGS. 8A to 8E. For example, the semiconductor light emitting diodes emitting red (R) light, green (G) light, and blue (B) light may be respectively assembled on the first to third assembly boards.

Referring to FIG. 11, each of a RED chip, a green chip, and a BLUE chip may be respectively assembled on the first to third assembly boards RED TEMPLATE, GREEN TEMPLATE, and BLUE TEMPLATE. In this state, the RED chip, the green chip, and the BLUE chip may be transferred to the wiring board by different transfer boards respectively.

Specifically, transferring the semiconductor light emitting diodes seated on the assembly board to the wiring board may include transferring the semiconductor light emitting diodes (RED chips) emitting the first color from the first assembly board (RED TEMPLATE) to a first transfer board (stamp (R)) by pressing the first transfer board (stamp (R)) against the first assembly board (RED TEMPLATE); transferring the semiconductor light emitting diodes (GREEN chips) emitting the second color from the second assembly board (GREEN TEMPLATE) to a second transfer board (stamp (G)) by pressing the second transfer board (stamp (G)) against the second assembly board (GREEN TEMPLATE); and transferring the semiconductor light emitting diodes (BLUE chips) emitting the third color from the third assembly board (BLUE TEMPLATE) to a third transfer board (stamp (B)) by pressing the third transfer board (stamp (B)) against the third assembly board (BLUE TEMPLATE).

thereafter, by individually pressing the first to third transfer boards to the wiring board, the semiconductor light emitting diodes emitting light of the first to third colors are transferred from the first to third transfer boards to the wiring board.

According to the manufacturing method of FIG. 11, three types of assembly boards and three types of transfer boards are required to manufacture a display device including a red chip, a green chip, and a BLUE chip.

On the other hand, referring to FIG. 12, each of a RED chip, a green chip, and a BLUE chip may be respectively assembled on the first to third assembly boards RED TEMPLATE, GREEN TEMPLATE, and BLUE TEMPLATE. In this state, the RED chip, the green chip, and the BLUE chip may be transferred to the wiring board by the same transfer board respectively.

Specifically, transferring the semiconductor light emitting diodes seated on the assembly board to a wiring board may include transferring the semiconductor light emitting diodes (RED chips) emitting the first color from the first assembly board (RED TEMPLATE) to a transfer board (RGB integrated stamp) by pressing the transfer board (RGB integrated stamp) against the first assembly board (RED TEMPLATE); transferring the semiconductor light emitting diodes (GREEN chips) emitting the second color from the second assembly board (GREEN TEMPLATE) to the transfer board (RGB integrated stamp) by pressing the transfer board (RGB integrated stamp) against the second assembly board (GREEN TEMPLATE); and transferring the semiconductor light emitting diodes (BLUE chips) emitting the third color from the third assembly board (BLUE TEMPLATE) to the transfer board (RGB integrated stamp) by pressing the transfer board (RGB integrated stamp) against the third assembly board (BLUE TEMPLATE).

In this case, alignment positions between the first to third assembly boards and the transfer board may be different from each other. For example, when alignment between the assembly board and the transfer board is completed, a relative position of the transfer board with respect to the first assembly board may be different from a relative position of the transfer board with respect to the second assembly board. The alignment position of the transfer board may be shifted by the PITCH of the SUB PIXEL whenever the type of the assembly board is changed. In this way, when the transfer board is sequentially pressed against the first to third assembly boards, all three types of chips may be transferred to the transfer board.

Thereafter, as in FIG. 11, the semiconductor light emitting diodes emitting light of the first to third colors are transferred from the transfer board to the wiring board by pressing the transfer board against the wiring board.

According to the manufacturing method of FIG. 12, three types of assembly boards and one type of transfer board are required to manufacture a display device including a red chip, a green chip, and a BLUE chip.

Unlike the above-described FIGS. 11 and 12, according to FIG. 13, the RED chip, the GREEN chip, and the BLUE chip may be assembled on one assembly board (RGB integrated TEMPLATE). In this state, the RED chip, the green chip, and the BLUE chip may be transferred to the wiring board by the same transfer board (RGB integrated stamp).

According to the manufacturing method of FIG. 13, one type of assembly board and one type of transfer board are required to manufacture a display device including a red chip, a green chip, and a BLUE chip.

As described above, when manufacturing a display device including semiconductor light emitting diodes that emit light of different colors, a manufacturing method thereof may be implemented in various ways. Hereinafter, a structure of the assembly board for increasing the yield of the method of manufacturing the display device described with reference to FIGS. 10A to 10C and FIGS. 11 to 13 will be described.

Prior to this, an electric field formed between the assembly electrodes formed during self-assembly described with reference to FIGS. 8A to 8E will be described.

FIGS. 14 and 15 are conceptual diagrams for describing a form of an electric field formed between assembly electrodes, and FIG. 16 is a conceptual diagram illustrating an example in which a semiconductor light emitting diode is mis-assembled.

Referring to FIGS. 14 and 15, when a voltage is applied to assembly electrodes 161c, an electric field is formed between the assembly electrodes 161c. The electric field μl is stronger as it is closer to the assembly electrodes, and is weaker as it is away from the assembly electrodes. The electric field may be strongly formed on the surface of a barrier rib adjacent to the assembly electrode.

The electric field guides the semiconductor light emitting diode into a groove formed by the barrier ribs, and places the semiconductor light emitting diode on a seating surface.

Here, the seating surface means a surface on which the semiconductor light emitting diode is seated after being guided into the groove. The groove is formed to pass through the barrier ribs such that a layer stacked on the lower side of the barrier ribs is exposed to the outside to form the seating surface. That is, the seating surface is not formed on a portion of the barrier ribs, but is formed on the layer disposed below the barrier ribs. However, the present disclosure is not limited thereto, and when an additional layer is stacked on the barrier ribs after the barrier ribs are formed, the seating surface may be formed on the additional layer. The seating surface will be described in detail below.

After the semiconductor light emitting diode is seated on the seating surface, a separation space is formed between the sidewall of the groove and the semiconductor light emitting diode. The separation space is generated as the size of the groove is larger than that of the semiconductor light emitting diode. When the size of the groove is the same as that of the semiconductor light emitting diode, it is difficult for the semiconductor light emitting diode to be guided into the groove. Therefore, the size of the groove should be larger than that of the semiconductor light emitting diode. That is, the size of the groove is formed in consideration of assembly tolerance.

Specifically, the groove may be formed to have a size of up to 120% of the size of the semiconductor light emitting diode. When the groove is formed larger than the size as described above, it is highly likely that two or more semiconductor light emitting diodes are assembled into one groove, and when the groove is formed too small, it is difficult to guide the semiconductor light emitting diode into the groove.

After the semiconductor light emitting diode is seated in the groove, the separation space formed between the sidewall of the groove and the semiconductor light emitting diode may cause mis-assembly of the semiconductor light emitting diode. Specifically, even when the semiconductor light emitting diode is seated in the groove during self-assembly, an electric field is still formed in the separation space. When the width of the separation space is greater than the thickness of the semiconductor light emitting diode, a new semiconductor light emitting diode may be mis-assembled into the separation space. The new semiconductor light emitting diode may be vertically assembled into the separation space. Specifically, referring to FIG. 16, new semiconductor light emitting diodes 450a' to 450c' may be mis-assembled into separation spaces respectively formed between the pre-assembled semiconductor light emitting diodes 450a to 450c and the sidewalls of the grooves.

The present disclosure provides an invention for preventing mis-assembly of new semiconductor light emitting diodes into separation spaces formed between pre-assembled semiconductor light emitting diodes and sidewalls of grooves.

Hereinafter, the present disclosure will be described in detail with reference to the accompanying drawings.

FIG. 17 is a cross-sectional view of an assembly board according to the present disclosure, FIG. 18 is a conceptual view of an assembly board according to the present disclosure viewed from the top of the board, and FIGS. 19 to 21 are conceptual views illustrating an assembly board according to another embodiment of the present disclosure.

An assembly board according to the present disclosure may include the above-described base portion 161a, assembly electrodes 161c, a dielectric layer 161b, and barrier ribs 161e. A description thereof is replaced with the above description.

Meanwhile, the assembly board according to the present disclosure includes a metal shielding layer 210 formed on the base portion 161a. The metal shielding layer 210 is used to shield an electric field formed between the assembly electrodes 161c.

The metal shielding layer 210 is disposed to overlap a portion of the seating surface so as to shield an electric field formed on a portion of the seating surface. The metal shielding layer 210 may be made of any one of Mo, Al, Ni, and Cr, or an alloy thereof. However, the present disclosure is not limited thereto.

The thickness of the metal shielding layer 210 is not specifically limited, but sufficient enough to completely shield the electric field formed in the assembly electrode.

The metal shielding layer 210 overlaps the edges of the seating surface to shield an electric field formed in a separation space formed between a semiconductor light emitting diode and the sidewall of a groove after the semiconductor light emitting diode is assembled. When the metal shielding layer 210 overlaps the entire seating surface, the electric field formed inside the groove is completely shielded, so that the semiconductor light emitting diode cannot be guided. Accordingly, the metal shielding layer 210 is preferably formed to a minimum.

The metal shielding layer 210 is preferably formed to overlap a portion of the seating surface that does not overlap the semiconductor light emitting diode while the semiconductor light emitting diode is seated on the seating surface. Assuming that the semiconductor light emitting diode and the groove have a circular shape, the overlapping degree of the metal shielding layer 210 and the seating surface is preferably determined according to a difference in diameter between the semiconductor light emitting diode and the groove.

In one embodiment, referring to FIG. 17, the metal shielding layer 210 may include a first region 211 disposed between the barrier rib 161e and the dielectric layer 161b, and a second region 212 extending from the first region 211 to overlap the seating surface.

The first region 211 overlaps the barrier rib 161e, and shields an electric field formed above the barrier rib. Through this, the semiconductor light emitting diode is prevented from being mis-assembled on the upper surface of the barrier rib rather than the inside of the groove.

Meanwhile, the second region 212 is formed to overlap the edges of the seating surface. Referring to FIG. 18, when the groove is viewed from the upper side, only the second region 212 is exposed to the outside. The second region 212 prevents new semiconductor light emitting diodes from being mis-assembled to a separation space formed between the pre-assembled semiconductor light emitting diode and the sidewalls of the grooves by shielding an electric field formed on the edges of the seating surface.

Meanwhile, as shown in FIG. 19, the present disclosure may further include an insulating layer 220 formed to cover the metal shielding layer 210. The insulating layer 220 may be formed before the barrier rib 161e to cover both the first region 211 and the second region 212.

When the assembly board according to the present disclosure includes the insulating layer 220, the seating surface may be formed on one surface of the insulating layer 220. That is, the semiconductor light emitting diode is seated on one surface of the insulating layer 220 exposed to the outside by the groove.

The insulating layer 220 prevents the metal shielding layer 210 from being electrically connected to the semiconductor light emitting diode or a wiring electrode from being electrically connected to the metal shielding layer 210.

Meanwhile, the aforementioned metal shielding layer 210 needs to be deposited on the dielectric layer 161b before the barrier ribs 161e are formed. However, the metal shielding layer 210 according to the present disclosure is not limited thereto, and may be formed even after the barrier ribs 161e are formed.

Specifically, referring to FIG. 20, the metal shielding layer 230 according to the present disclosure may include a metal shielding layer base portion 231 formed on the sidewall of the groove and a shielding portion 232 extending from the metal shielding layer base portion 231 and extending along the dielectric layer to overlap the seating surface.

The metal shielding layer 230 may be formed through deposition after the barrier ribs 161e are formed. In this case, the metal shielding layer 230 may be formed on a sidewall of the groove and a portion of the seating surface.

Meanwhile, depending on deposition methods, the metal shielding layer 230 may be formed to extend to the upper surface of the barrier rib. Specifically, the metal shielding layer 230 may further include a protrusion 233 extending from the metal shielding layer base portion 231 and formed on the upper surface of the barrier rib 161e.

The protrusion 233 shields an electric field formed on the upper side of the barrier rib. Through this, the semiconductor light emitting diode is prevented from being mis-assembled on the upper surface of the barrier rib rather than the inside of the groove. When the protrusion 233 is formed to surround the groove, it is possible to prevent the semiconductor light emitting diode from entering edges of the groove and being vertically assembled in the above-described separation space.

According to the structure described with reference to FIG. 20, the seating surface may be formed on the dielectric layer 161b. Meanwhile, when the metal shielding layer 230 is formed to have a predetermined thickness or more, the semiconductor light emitting diode may be seated on the metal shielding layer 230.

Meanwhile, as shown in FIG. 21, the present disclosure may further include an insulating layer 220 formed to cover the metal shielding layer 210. The insulating layer 240 may be formed to cover all of the metal shielding layer base portion 231, the shielding portion 232, and the protrusion 233.

When the assembly board according to the present disclosure includes the insulating layer 240, the seating surface may be formed on one surface of the insulating layer 240. That is, the semiconductor light emitting diode is seated on one surface of the insulating layer 240 exposed to the outside by the groove.

The insulating layer 240 prevents the metal shielding layer 230 from being electrically connected to the semiconductor light emitting diode or a wiring electrode from being electrically connected to the metal shielding layer 230. In addition, the insulating layer 240 prevents the metal shielding layer 240 from being exposed to the outside and oxidized during repeated self-assembly.

As described above, since the assembly board according to the present disclosure includes a metal shielding layer that completely shields an electric field at an unnecessary position, it is possible to prevent a new semiconductor light emitting diode from being mis-assembled in an area where self-assembly is completed.

What is claimed is:

1. An assembly board for positioning semiconductor light emitting diodes at preset positions for manufacturing a display device, the assembly board comprising:
a base portion;
a plurality of assembly electrodes disposed on the base portion;
a dielectric layer on the base portion to cover the assembly electrodes;
a plurality of barrier ribs disposed on the dielectric layer and configured to define a plurality of grooves for guiding the semiconductor light emitting diodes to seating surfaces of the preset positions;
a metal shielding layer at each seating surface formed on the dielectric layer; and
an insulating layer formed to cover the metal shielding layer,
wherein the metal shielding layer overlaps a portion of a corresponding seating surface such that an electric field formed on the portion of the corresponding seating surface is shielded,
wherein the metal shielding layer is formed to overlap with edges of the corresponding seating surface, and
wherein the metal shielding layer includes:
a first region disposed between a corresponding barrier rib and the dielectric layer; and
a second region extending from the first region to overlap the corresponding seating surface.

2. The assembly board of claim 1, wherein the seating surfaces are formed on a surface of the insulating layer.

3. An assembly board for positioning semiconductor light emitting diodes at preset positions for manufacturing a display device, the assembly board comprising:
a base portion;
a plurality of assembly electrodes disposed on the base portion;
a dielectric layer on the base portion to cover the assembly electrodes;
a plurality of barrier ribs disposed on the dielectric layer and configured to define a plurality of grooves for guiding the semiconductor light emitting diodes to seating surfaces of the preset positions; and
a metal shielding layer at each seating surface formed on the dielectric layer,
wherein the metal shielding layer overlaps a portion of a corresponding seating surface such that an electric field formed on the portion of the corresponding seating surface is shielded,
wherein the metal shielding layer is formed to overlap with edges of the corresponding seating surface,
wherein the metal shielding layer includes a metal shielding layer base portion formed on a sidewall of a corresponding groove of the plurality of grooves, and a shielding portion extending from the metal shielding layer base portion and extending along the dielectric layer to overlap the corresponding seating surface, and wherein the metal shielding layer includes a protrusion extending from the metal shielding layer base portion and formed on an upper surface of a corresponding barrier rib of the plurality of barrier ribs.

4. The assembly board of claim 3, wherein the protrusion is formed to surround the groove.

5. The assembly board of claim 4, wherein the seating surfaces are formed on a surface of the dielectric layer.

6. The assembly board of claim 4, further comprising:
an insulating layer formed to cover the metal shielding layer,
wherein the seating surfaces are formed on a surface of the insulating layer.

* * * * *